Dec. 14, 1954 G. C. DACEY ET AL 2,697,052

FABRICATING OF SEMICONDUCTOR TRANSLATING DEVICES

Filed July 24, 1953 2 Sheets-Sheet 1

INVENTORS: G. C. DACEY
P. W. FOY
BY [signature]
ATTORNEY

INVENTORS: G. C. DACEY
P. W. FOY
BY
ATTORNEY

United States Patent Office 2,697,052
Patented Dec. 14, 1954

2,697,052

FABRICATING OF SEMICONDUCTOR TRANSLATING DEVICES

George C. Dacey, Chatham, and Philip W. Foy, Plainfield, N. J., assignors to Bell Telephone Laboratories, Incorporated, New York, N. Y., a corporation of New York Application July 24, 1953, Serial No. 370,092
5 Claims. (Cl. 148—1.5)

Figure 1:
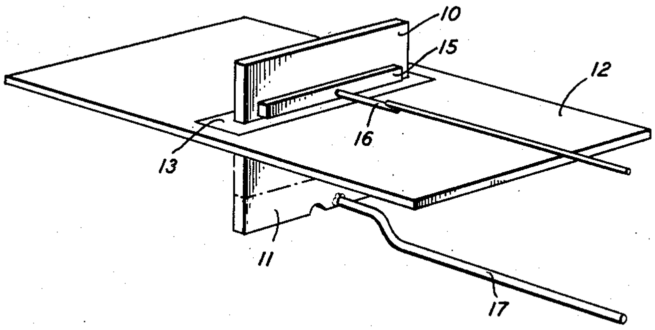

This invention relates to semiconductor signal translating devices and more particularly to methods for fabricating such devices of the general type disclosed in the application Serial No. 318,053, filed October 31, 1952, of G. C. Dacey and I. M. Ross. Devices of this type now are referred to as field effect transistors.

Transistors of the type disclosed in the application above identified comprise, in general, a bar or wafer of semiconductive material, for example germanium or silicon, the bulk of which is of one conductivity type, that is N or P type. The bar or wafer has therein in opposite faces a pair of juxtaposed zones of the opposite conductivity type which form boundaries of a channel in the bulk. Electrical connections, termed the source and the drain, are made to the semiconductive body adjacent opposite ends of the channel aforementioned. A third connection, designated the gate, is made to the juxtaposed zones.

In operation, the source and drain are biased relative to the gate so that the junctions between the bulk and the zones are biased in the reverse direction thereby to establish space charge regions at these junctions. The drain is maintained at a higher potential than the source thereby to attract thereto majority carriers in the bulk. Signals are impressed between the gate and the source whereby the widths of the space charge regions at the junctions are varied and the transverse area of the channel is altered accordingly. Thus, the resistance of the current path between the source and drain and, hence, the current in a load circuit connected between these are modulated in accordance with the signals.

In a typical device, the bulk of the bar or wafer may be of N conductivity type, wherein the majority carriers are electrons, and the gate zones may be of P conductivity type. Both the source and drain are biased positive with respect to the gate, the drain at the higher potential. Hence, the gate zone-bulk junctions are biased in the reverse direction and the output current is due to electrons flowing through the bulk from the source to the drain.

One of the operating characteristics of particular moment for such devices is the maximum frequency of operation. This is dependent largely upon the length of the channel and the nature of the electric field extant in the channel during operation. Desiderata are that the channel length be small and that the field be uniform throughout the length of the channel thereby to substantially eliminate non-linear effects. Heretofore, such effects have unduly restricted the frequency range.

Another factor of moment is the power handling capacity of the devices. This is dependent upon the temperature which is attained during operation of the device and particularly the temperature reached by the gate regions or zones. In devices of known constructions, the power handling capacity has been limited.

One general object of this invention is to improve the performance of field effect transistors and, more particularly, to extend the frequency range and enhance the power handling capacity thereof.

Another object of this invention is to enable and facilitate the fabrication of such transistors having therein a channel of prescribed, uniform and extremely small dimensions.

In one illustrative embodiment of this invention, the gate zones in the semiconductive body are produced by alloying with aligned opposite face portions of a bar or wafer, an impurity capable of altering the conductivity type of the semiconductive material. For example, if the semiconductive body is of N type, P type gate zones are produced in opposite faces thereof by alloying an acceptor material, such as indium, with the bulk material at the regions desired. If the bulk of the body is of P type, N type gate zones are produced by alloying a donor material, such as antimony, with the bulk material at the regions desired.

In accordance with one feature of this invention, the donor or acceptor is applied to the body initially in strip form and, during the heating cycle requisite to effect the alloyage, is confined under pressure to restrict the region over which the alloying occurs.

In one specific embodiment, the semiconductive wafer of N type germanium is inserted lengthwise through an oversize aperture in a metallic fin or plate of prescribed thickness corresponding substantially to the desired length of the gate zones. Strips or foil of indium are placed between the wafer and the bounding walls of the aperture and then the aperture is closed by plates which bear against opposite faces of the fin, pressure being applied to the plates on one side as by a weight resting thereon. The entire assembly is heated to a temperature such that the indium alloys with surface portions of the wafer and seals to the fin. The molten indium is confined by the aperture closure members or plates during the heating cycle whereby the alloyage is restricted to regions substantially equal in extent to the thickness of the fin. Thus, gate zones of very short length and uniform extent and configuration are achieved. The fin is united intimately to the gate zones by the indium and constitutes a heat radiating element of substantial area which enables rapid and substantial cooling of the wafer, and particularly the gate zones, during operation of the transistor.

Figures 2, 3:
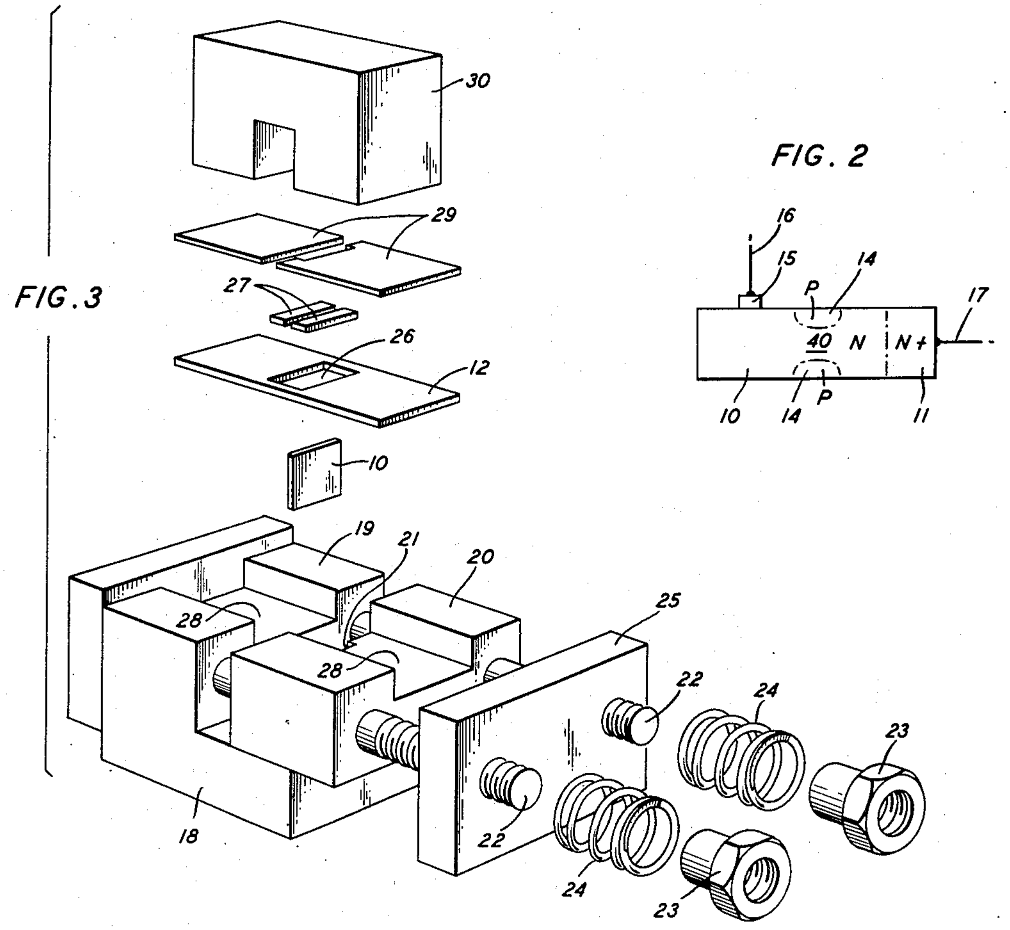
Figure 4:
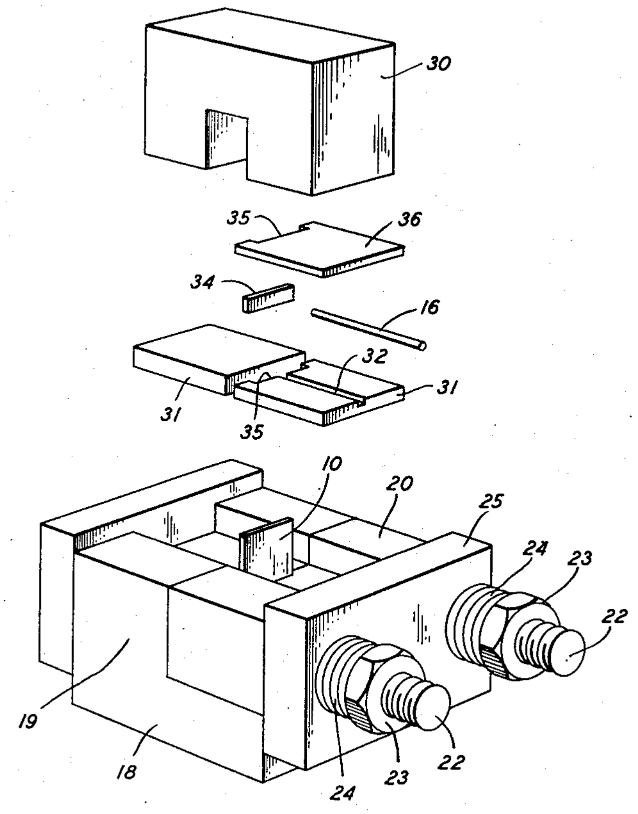

The invention and the above noted and other features thereof will be understood more clearly and fully from the following detailed description with reference to the accompanying drawing in which:

Fig. 1 is a perspective view of a field effect transistor illustrative of one embodiment constructed in accordance with this invention;

Fig. 2 is an enlarged sectional view of a portion of the transistor of Fig. 1 with the cooling fin or plate omitted, showing particularly the gate zones therein; and Figs. 3 and 4 are exploded perspective views depicting typical apparatus employed in the fabrication of translating devices in accordance with this invention and the correlation of parts at two different stages in the fabrication cycle.

Referring now to the drawing, the field effect transistor portrayed in Figs. 1 and 2 comprises a wafer 10 of semiconductive material, such as germanium or silicon, of one conductivity type and advantageously having at one end thereof a zone 11 of greater conductivity than the bulk of the wafer. For example, as indicated in Fig. 2, the bulk of the body may be of N conductivity type and the region 11 thereof may be of higher conductivity N type, indicated by N+. The semiconductive wafer 10 extends through an aperture in a metallic cooling fin or plate 12, to which the wafer is firmly secured by a filling 13 of a material which upon alloying with the semiconductive material effects an inversion in the conductivity type of zones of the material. For example, when the body is of N conductivity type germanium, the material 13 may be indium which alloys with germanium to form a P conductivity type zone 14 embracing the bulk of the wafer. As is shown in Fig. 2, the zone 14, referred to as the gate, defines a channel 40 within the bulk of the wafer 10.

The fin or plate 12 serves as a substantially ohmic connection to the gate zone 14. A second ohmic connection 15 having a lead wire 16 connected thereto is made to the bulk of the body in immediate proximity to the gate zone 14, the connection 15 constituting the source. A third ohmic connection 17, for example in the form of a wire soldered to the wafer 10 and constituting the drain connection, is made to the higher conductivity zone 11.

In the fabrication of the transistor, the several constituent elements are held in cooperative relation in a jig, designated generally as 18 and which, as illustrated in Figs. 3 and 4, comprises a fixed jaw 19 and a movable jaw 20, having in the inner face thereof a recess 21 for accommodating the semiconductive wafer 10. The jaws are arranged to be held together with the wafer 10 clamped in the recess 21 through threaded studs 22 and nuts 23, bearing against an end plate 25, through springs 24, the end plate 25 being adapted to bear against the movable jaw 20.

In the first phase of the fabrication, the semiconductive wafer 10 is clamped between the jaws 19 and 20 and the cooling fin or plate 12 is seated upon the surfaces 28 of the jaws, the wafer extending through the aperture 26 substantially at the medial plane thereof. The alloyable material in the form of two strips 27 on opposite side of the wafer 10, is inserted into the aperture 26 and substantially fills this aperture. Advantageously the strips 27 are substantially the same or slightly greater thickness than the fin or plate 12. Plates 29 are seated upon the plate 12 and strips 27 and held in place by a weight 30.

The entire assembly then is heated to wet the strips 27 to the semiconductive wafer 10 and the fin or plate 12. After cooling following this wetting, the assembly illustrated in Fig. 4 is utilized. Specifically the plates 29 have seated thereon spacer plates 31, one of which has a groove 32 therein for positioning the source lead 16. A strip of material 34 of character hereinafter described is seated sidewise upon one of the plates 29, in similar positioning grooves 35 in the spacer 32 and a cooperating spacer 36, whereby it is held in firm engagement with the semiconductive wafer. The weight 30 is seated upon the members 31 and 36. The entire assembly then is heated to effect alloyage of the material of strips 27 with the semiconductor and at the same time fuse the strip 15 to the wafer.

It will be noted that during the alloying cycle, the material of strips 27 is totally confined within the aperture 26 by virtue of the surfaces 28 and plates 29, and that a pressure is maintained thereon by the weight 30. Thus the area of alloyage of the material of these strips is restricted to substantially the width of the cooling plate or fin 12. Also uniformity of alloyage is realized whereby a channel 40 of substantially uniform transverse dimensions is obtained.

In a specific and illustrative embodiment of the invention, the wafer 10 may be germanium, 0.010 inch thick, 0.130 inch wide and 0.150 inch long. The wafer is thoroughly cleaned as by etching followed by rinsing with distilled water. The fin or plate 12 may be of aluminized steel 0.005 inch thick having an aperture 26 therein 0.150 inch by 0.045 inch. Advantageously the wafer faces of the fin, particularly the faces thereof adjacent the aperture 26 are such that they will not be wet by the alloying material 13. The film of $FeAl_3$ on these surfaces is effective for this purpose. Nickel and platinum fins with the noted surfaces or portions calorized also may be used.

The jig 18 may be of stainless steel throughout and to prevent sticking of the transistor components thereto advantageously the jig surfaces are coated, for example by rubbing with graphite followed by a light coating of Aquadag. The weight 30 may be of the order of 60 grams.

For the case of an N-type wafer 10, the strips 27 may be of indium 0.007 thick and 0.025 inch by 0.150 inch. They are thoroughly cleaned, for example by etching first in hydrochloric acid and then in concentrated nitric acid, followed by rinsing with distilled water.

In the first heating cycle, the elements are assembled in the jig in the manner above described with reference to Fig. 3. The assembly then is heated at about 200° C. in a hydrogen oven for a time of about 2 minutes, whereby the indium melts and wets both the germanium wafer 10 and the bounding surfaces of the aperture 26. Following this, the oven is allowed to cool to room temperature.

Then the components are assembled in the jig in the manner described hereinabove with reference to Fig. 4. The strip 34, which forms the source connection, may be of lead-tin eutectic (50% lead, 50% tin) and 0.100 inch by 0.007 inch by 0.020 inch, spaced 0.003 inch from the fin 10. The lead wire 16 may be a nickel wire 0.005 inch in diameter. The entire assembly is heated in a hydrogen oven at 495° C. for 5 minutes. As a result, the indium alloys with the germanium to form the P-type gate zone 14. Also it adheres to the fin 12. Further, during this heating, the source strip 34 wets to the germanium and defines a substantially ohmic contact therewith, the lead 16 is joined to the strip 34.

For a heating period of 5 minutes at 495° C. and a germanium wafer 10 of bulk resistivity of 20 ohm centimeters, the indium penetrates the germanium substantially 0.0025 inch at each face, thereby providing a thickness of 0.001 inch for the channel 40. Because of the confinement of the indium, heretofore discussed, the length of the gate zone 14 is substantially 0.005 inch. Further, the penetration is substantially uniform so that the channel thickness is similarly uniform throughout its length. The configuration of the zone 14 in a typical device is depicted in Fig. 2.

Following the alloying cycle, the assembly is cooled to room temperature and the drain lead 17 is affixed to the N+ zone 11. For example this lead may be a 0.005 inch nickel wire soldered to the wafer 10.

Advantageously, the transistor unit then is etched electrolytically, specifically at room temperature for 1 minute at 0.5 ampere in a 20 per cent by weight sodium hydroxide electrolyte. In this step, the gate is made positive, e. g. about 1.5 volts, and a platinum wire loop is used as the cathode.

Typical transistors constructed as above described exhibited a transconductance as high as 1.6 ma./v. and a frequency cut off of 50 megacycles per second, and were capable of dissipating 6 watts power in continuous operation with practically negligible temperature rise.

What is claimed is:

1. The method of fabricating a semiconductor signal translating device which comprises mounting a body of semiconductive material within an aperture in a plate, the body being spaced from the walls of said aperture, inserting into the space between said body and said walls a body of impurity capable of alloying with the semiconductor material to alter the conductivity of said material, heating the semiconductor and impurity bodies at a temperature to alloy the impurity with the semiconductive material, and, during said heating, confining the impurity body between opposite ends of said aperture, thereby to produce in said body zones of prescribed extent of altered conductivity.

2. The method of fabricating a semiconductor signal translating device which comprises mounting a body of semiconductive material in an aperture extending between two faces of a metallic plate, said body having two opposite face portions spaced from the wall portions of said aperture in juxtaposition thereto, inserting into the spaces between said face and wall portions bodies of impurity capable of altering the conductivity of said semiconductive material, heating the semiconductive body and impurity bodies at a temperature to alloy said impurity with said semiconductive material, and, during the heating, confining said bodies of impurity between said faces of said plate.

3. The method of fabricating a semiconductor signal translating device which comprises mounting a wafer of semiconductive material in an aperture extending through a metallic plate, the wafer extending beyond opposite faces of said plate and having its major faces spaced from the juxtaposed bounding walls of said aperture, substantially filling the space between said major faces and said walls with an impurity material capable of altering the conductivity type of said semiconductive material upon alloyage therewith, heating said wafer and impurity material to affect alloyage thereof, and, during said heating, maintaining said impurity material under pressure in the direction normal to said faces of said plate.

4. The method of producing a P-conductivity type zone in a wafer of N-type germanium, which comprises mounting the wafer in an aperture in a metallic plate with the wafer extending beyond the faces of said plate and having its major faces spaced from the walls of said aperture in juxtaposition thereto, fitting strips of indium into the spaces between said major faces and said aperture walls, said strips being of thickness greater than that of said plate, heating the assembly at substantially 495° C., thereby to effect alloyage of the indium with the germanium, and during the heating step maintaining pressure upon the indium to confine it between said faces of said plate.

5. The method in accordance with claim 4 which comprises mounting a strip of lead-tin eutectic in contact with one of said major faces prior to the heating step.

No references cited.